(12) United States Patent
Jeong

(10) Patent No.: US 11,424,151 B2
(45) Date of Patent: Aug. 23, 2022

(54) LIFTING DEVICE

(71) Applicant: XIA TAI XIN SEMICONDUCTOR (QING DAO) LTD., Qingdao (CN)

(72) Inventor: Woohyun Jeong, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 327 days.

(21) Appl. No.: 16/680,791

(22) Filed: Nov. 12, 2019

(65) Prior Publication Data

US 2021/0134638 A1    May 6, 2021

(30) Foreign Application Priority Data

Oct. 31, 2019    (CN) .......................... 201911049589.3

(51) Int. Cl.
*H01L 21/683* (2006.01)
*H01F 7/02* (2006.01)
*H01L 21/3065* (2006.01)

(52) U.S. Cl.
CPC ....... *H01L 21/6833* (2013.01); *H01F 7/0221* (2013.01); *H01F 7/0236* (2013.01); *H01L 21/3065* (2013.01)

(58) Field of Classification Search
CPC ............. H01L 21/6833; H01L 21/3065; H01L 21/68742; H01L 21/68764; H01F 7/0221; H01F 7/0236; H01F 7/129; H01F 7/1607
USPC .......................................................... 361/234
See application file for complete search history.

(56) References Cited

U.S. PATENT DOCUMENTS 4,790,258 A    12/1988 Drage et al.
5,879,523 A     3/1999 Wang et al.

FOREIGN PATENT DOCUMENTS

CN          1050463 A      4/1991

OTHER PUBLICATIONS

GB 2140626; Entire specification and Figures; Titel: Electromagnetic actuator incorporating anti-chatter device; Publication date: 1984 (Year: 1984).*

* cited by examiner

*Primary Examiner* — Dharti H Patel
(74) *Attorney, Agent, or Firm* — ScienBiziP, P.C.

(57) ABSTRACT

A lifting device includes a base body. The base body includes a supporting surface and defines a cavity. The cavity extends through the supporting surface. The lifting device further includes a magnetic bar, a spring, and a coil in the cavity. The spring includes a first end fixed to an end of the magnetic bar away from the supporting surface and a second end fixed on a wall of the cavity. The coil surrounds the magnetic bar. When the coil is applied with a voltage to generate an electromagnetic induction, the magnetic bar is driven to move out of the cavity from the supporting surface or move to compress the spring.

17 Claims, 7 Drawing Sheets

LIFTING DEVICE

FIELD

The subject matter herein generally relates to product handling, particularly relates to a lifting device configured to move a product up and down.

BACKGROUND

In conventional manufacturing processes of semiconductor components, for example, manufacturing of chips generally includes forming hundreds or even millions of electronic components on a wafer. With the miniaturization and integration of chips, the manufacturing of chips faces higher requirements. During a manufacturing process of the chip, a silicon wafer is generally positioned on a supporting platform or a lifting platform to carry out processes such as surface coating, etching. Therefore, there is room for improvement in the art.

BRIEF DESCRIPTION OF THE DRAWINGS

Implementations of the present technology will now be described, by way of embodiment, with reference to the attached figures.

DETAILED DESCRIPTION

Figure 1:
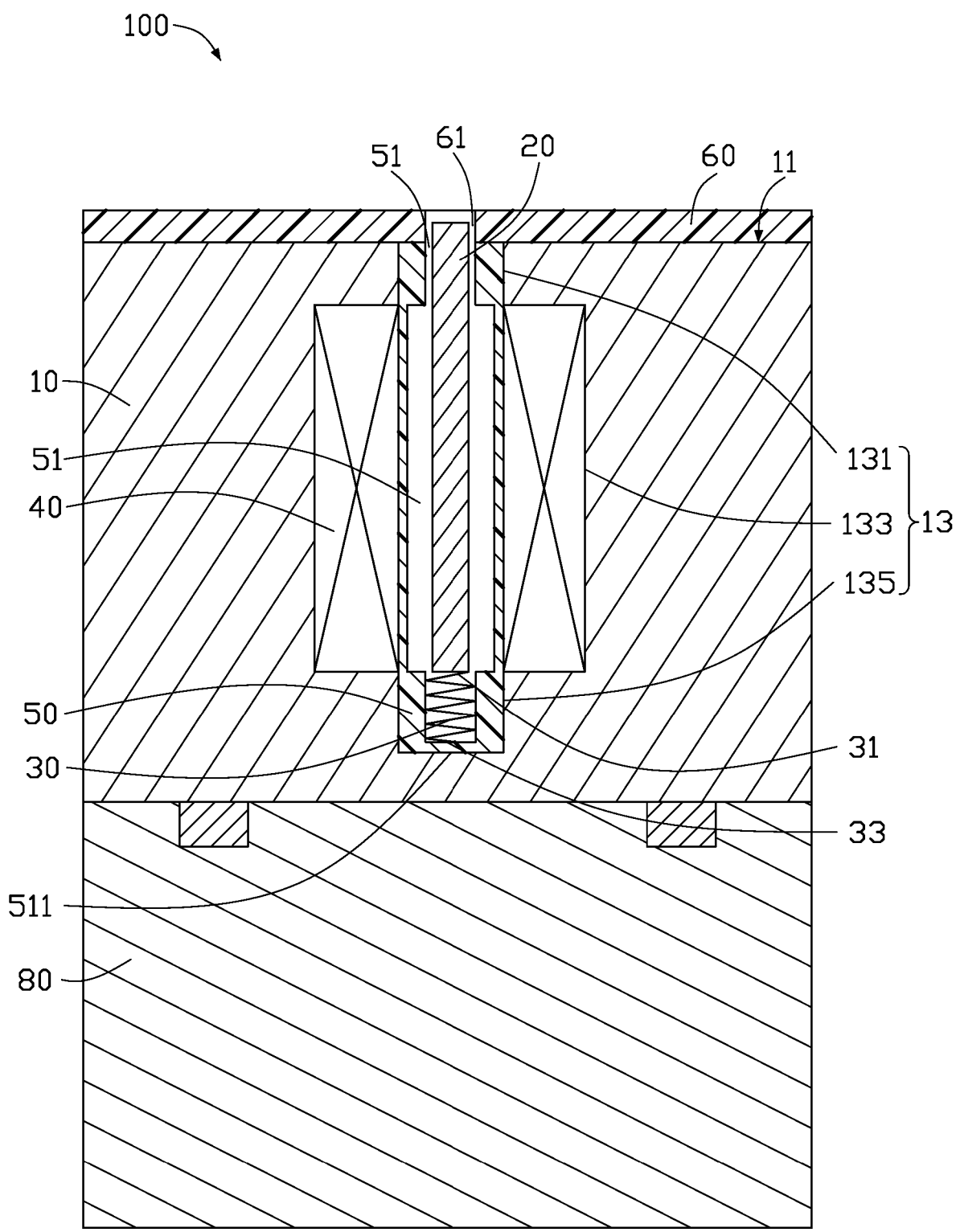
FIG. 1 is a cross-sectional view of a lifting device according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

Referring to FIG. 1, a lifting device 100 according to an embodiment of the present disclosure includes a base body 10. The base body 10 includes a supporting surface 11 and defines a cavity 13 extending through the supporting surface 11. The lifting device 100 further includes a magnetic bar 20, a spring 30, and a coil 40 in the cavity 13. The magnetic bar 20 has a rod shape and is vertically positioned in the cavity 13. The spring 30 has a first end 31 and a second end 33 opposite to the first end 31. The first end 31 is fixed at an end of the magnetic bar 20 away from the supporting surface 11. The second end 33 is fixed on a wall of the cavity 13. The spring 30 is configured to elastically support the magnetic bar 20. The coil 40 surrounds the magnetic bar 20. The coil 40 is electrically coupled to a power supply element (not shown) to apply a voltage to the coil 40. When the coil 40 is applied with a voltage, electromagnetic induction causes the magnetic bar 20 to move thereby at least a portion of the magnetic bar 20 is outside the cavity 13 from the supporting surface 11 or the magnetic bar 20 compresses the spring 30.

The magnetic bar 20 is movably arranged in the cavity 13 and is able to move between a retracted position and a exerted position. When the magnetic bar 20 is in the retracted position, the magnetic bar 20 is completely in the cavity 13 and the spring 30 is compressed. When the magnetic bar 20 is in the exerted position, at least a portion of the magnetic bar 20 is outside the cavity 13 and the spring 30 is stretched.

As shown in FIG. 1, the cavity 13 is divided into three parts from top to bottom. These are an opening portion 131, a middle cavity 133, and a bottom cavity 135. The opening portion 131 extends through the supporting surface 11 and air communicates with middle cavity 133. The middle cavity 133 is between the opening portion 131 and the bottom cavity 135. When the magnetic bar 20 moves up and down, the magnetic bar 20 can pass through the opening portion 131 to be outside the cavity 13 from the supporting surface 11. Both the opening portion 131 and the bottom cavity 135 have diameters less than a diameter of the middle cavity 133. The coil 40 is located in the middle cavity 133. The spring 30 is positioned in the bottom cavity 135 and can be stretched into the middle cavity 133.

The supporting surface 11 of the base body 10 is configured for placing a product to be processed (for example a silicon wafer 200, shown in FIG. 6D). The product can be lifted up by the magnetic bar 20, and can be placed on the supporting surface 11 by the magnetic bar 20 moving into the cavity 131. In order to support the product stably, a number of the magnetic bars 20 may be two or more. For example, the base body 10 may be provided with two or more cavities 13, and each cavity 13 is provided with one magnetic bar 20, one spring 30, and one coil 40. FIG. 1 shows only one magnetic bar 20 and one cavity 13 as an example. Alternatively, a cross-section area of the magnetic bar 20 is designed to be sufficiently large relative to a surface area of the product, thus the product can be stably supported by one single magnetic bar 20. When the product is stably placed on the supporting surface 11, the product can be processed, such as for vacuum coating, plasma etching, and the like.

When the coil 40 is not applied with a voltage, the spring 30 supports the magnetic bar 20 by an elastic force of the spring 30. At this time the spring force of the spring 30 is equal to the gravity of the magnetic bar 20.

When the coil 40 is applied with a voltage, the moving direction of the magnetic bar 20 can be controlled by controlling a direction of current of the coil 40. In one embodiment, when the coil 40 is applied with a positive voltage, the magnetic bar 20 moves upward and at least a portion of the magnetic bar 20 is outside the cavity 13, and the spring 30 is stretched. When the coil 40 is applied with a negative voltage, the magnetic bar 20 moves downward into the cavity 13, and the spring 30 is compressed. In another embodiment, when the coil 40 is applied with a negative voltage, the magnetic bar 20 moves upward and at least a portion of the magnetic bar 20 is outside the cavity 13, and the spring 30 is stretched. When the coil 40 is applied with a positive voltage, the magnetic bar 20 moves downward to retreat into the cavity 13, and the spring 30 is compressed.

The spring 30 is positioned under the magnetic bar 20 to support the magnetic bar 20. The spring 30 can provide a certain space for the downward movement of the magnetic bar 20 and limits a distance of movement upward of the magnetic bar 20. The downward movement of the magnetic bar 20 is along a direction to compress the spring 30; and the upward movement of the magnetic bar 20 is along a direction to stretch the spring 30.

In one embodiment, when the coil 40 is not applied with a voltage, the magnetic bar 20 may be completely received in the cavity 13. Therefore, when the magnetic bar 20 is outside the cavity 13, and the coil 40 is suddenly powered off due to a malfunction, the magnetic bar 20 will fall down in the cavity 13, so that the product will fall on the supporting surface 11.

In this embodiment, the lifting device 100 is configured to support a product and the product is plasma etched. The lifting device 100 may be positioned in a plasma etching chamber. Due to the principles of plasma etching, it is desirable to prevent plasma contacting some components in the lifting device 100 to avoid arcing. In one embodiment, the base body 10 is made of a metal or an alloy, such as aluminum, copper, aluminum alloy, copper alloy, or the like. Therefore, if the base body 10 is directly exposed to the plasma, the plasma would contact the base body 10 and generate some arcing.

In order to avoid arcing, as shown in FIG. 1, the lifting device 100 further includes an electro-static chuck 60 and a spacer 50. The electro-static chuck 60 completely covers the supporting surface 11 to prevent the plasma from contacting the supporting surface 11. The electro-static chuck 60 is made of ceramic material. The spacer 50 is made of ceramic and is positioned in the cavity 13 to prevent the plasma from contacting the base body 10. Neither ceramic nor plastic react with the plasma.

The electro-static chuck 60 adsorbs and fixes the product by electrostatic force. In the field of manufacturing semiconductor, an electro-static chuck is usually provided on an etching machine for etching or a coating machine for performing vacuum coating.

As shown in FIG. 1, the electro-static chuck 60 defines a through hole 61 aligning with the opening portion 131 of the cavity 13. The electro-static chuck 60 is configured for placing products (such as silicon wafers) to be plasma etched. The magnetic bar 20 can move through the through hole 61.

As shown in FIG. 1, the spacer 50 has a hollow cylindrical shape and defines a channel 51. An outer contour of the spacer 50 is matched with a shape of the cavity 13, and the spacer 50 completely attaches to the wall of the opening portion 131 and the bottom cavity 135, but does not fit the wall of the middle cavity 133. Therefore, the plasma can only enter into the channel 51 in the cavity 13 and can only contact the wall of the channel 51, and cannot contact the wall of the cavity 13. Thus the plasma can be effectively prevented from contacting the base body 10. The spacer 50 surrounds both the magnetic bar 20 and the spring 30 and is surrounded by the coil 40. Both the magnetic bar 20 and the spring 30 are positioned in the channel 51 and the magnetic bar 20 is movable up and down along the channel 51. The coil 40 may be wound around the spacer 50. The second end 33 of the spring 30 is fixed to the spacer 50, specifically it is fixed to the bottom wall 511 of the channel 51.

Figure 3:
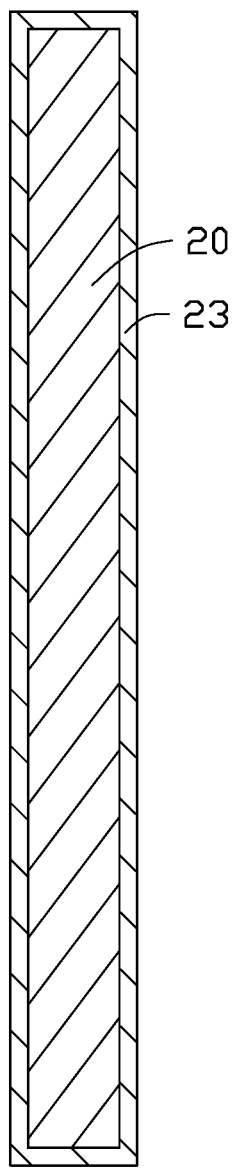
FIG. 3 is a cross-sectional view of a magnetic bar of the lifting device of FIG. 1.

The magnetic bar 20 is made of a magnetic material. When the lifting device 100 is placed in a plasma environment, outer surfaces of the magnetic bar 20 needs to be entirely covered with an insulation layer 23 to isolate the plasma from contacting the magnetic bar 20, as shown in FIG. 3. The insulating layer 23 can be made of ceramic, quartz, sapphire, or plastic.

The spring 30 is covered by or made of insulating material to prevent the plasma from reacting with the spring 30. For example, plastic can cover the spring 30.

As shown in FIG. 1, the lifting device 100 further includes a heat dissipating base 80 coupled to a side of the base body 10 away from the supporting surface 11. The heat dissipating base 80 is configured to conduct and divert heat generated by the lifting device 100.

It can be understood that when the lifting device 100 is not used in the plasma etching chamber, the requirements that the electro-static chuck 60 is made of ceramic and that the spring 30 is made of an insulator do not apply, and the spacer 50 and the insulation layer 23 covering the magnetic bar 20 are not required.

The working manner of the lifting device 100 will be described below. FIG. 2A through FIG. 2G show working steps of the lifting device 100.

Figure 2A:
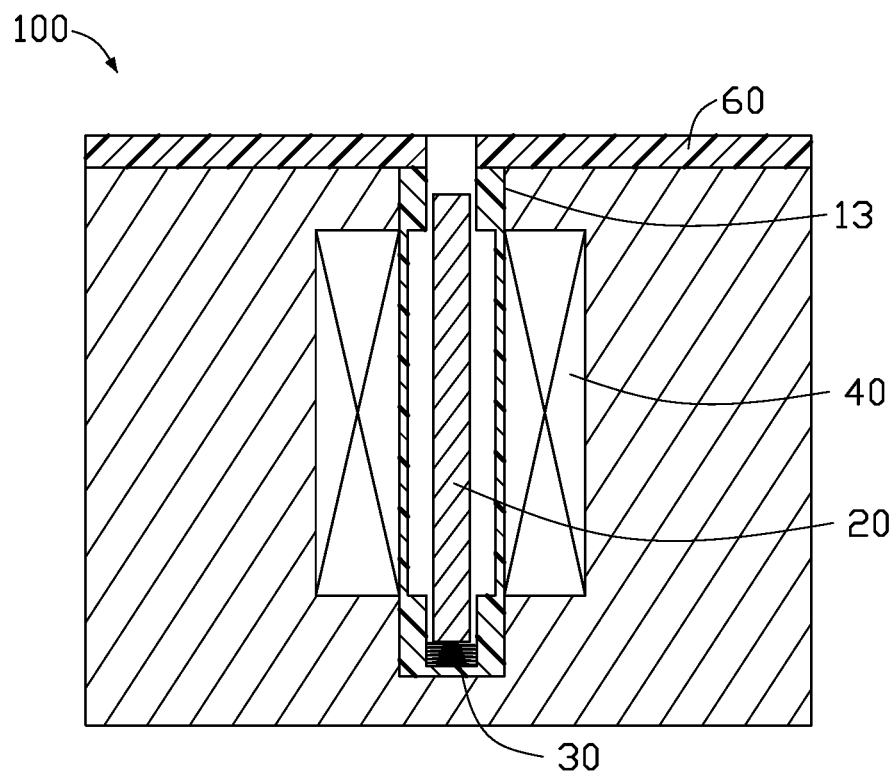
FIG. 2A shows the lifting device of FIG. 1 is in a state of waiting for a product.

Referring to FIG. 2A, the lifting device 100 is in a state of waiting for the product (the silicon wafer 200). At this time, the coil 40 is applied with a negative voltage. The magnetic bar 20 moves to compress the spring 30 and the magnetic bar 20 completely retreats into the cavity 13. The magnetic bar 20 moves until the spring 30 is compressed to a limit. In one embodiment, the negative voltage is −24 volts.

Figure 2B:
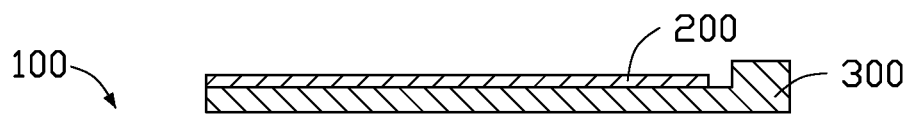
FIG. 2B shows a silicon wafer is above the lifting device.
Figure 2B:
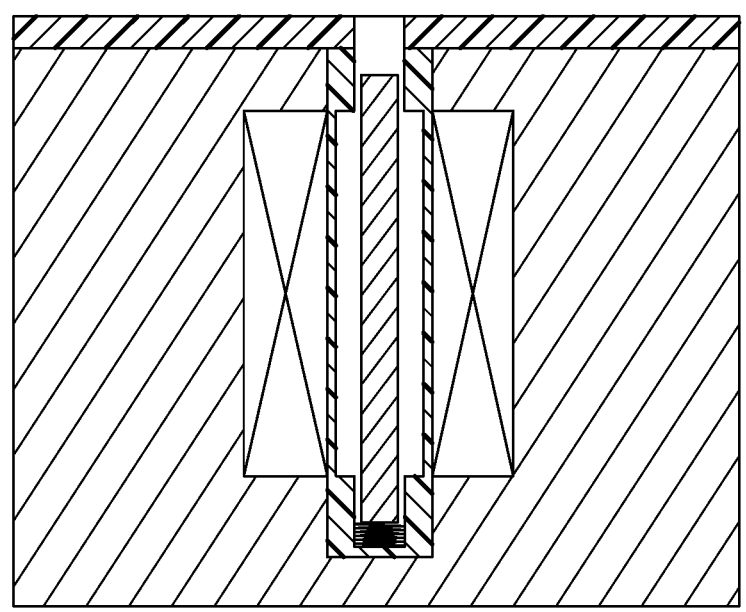

Referring to FIG. 2B, the negative voltage (−24 volts) is maintained, and then a mechanical arm 300 carrying with the silicon wafer 200 is moved above the lifting device 100.

Figure 2C:
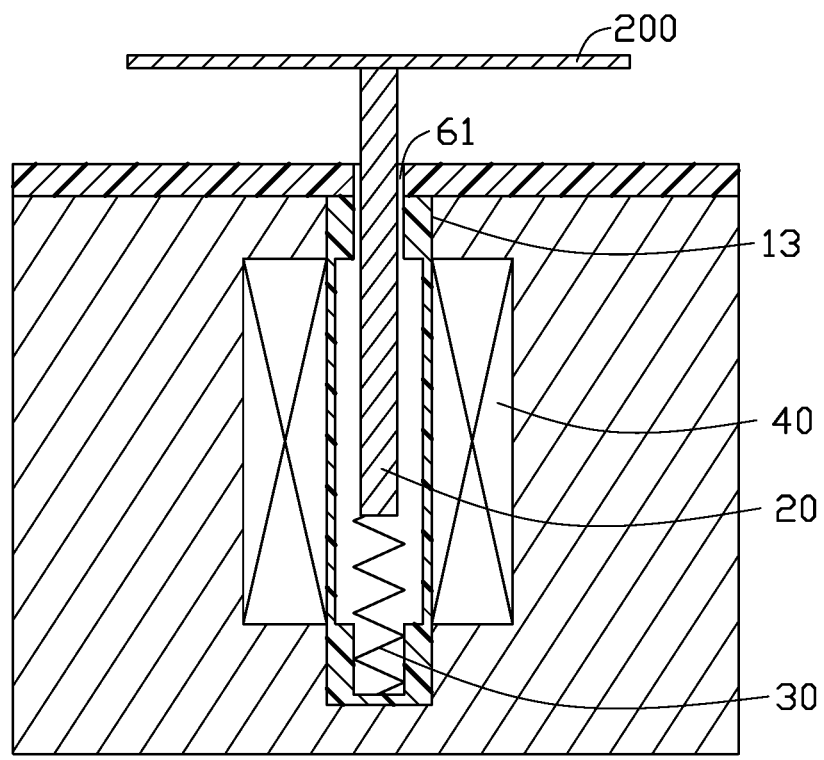
FIG. 2C shows a magnetic bar of the lifting device moves to support the silicon wafer.
Figure 4:
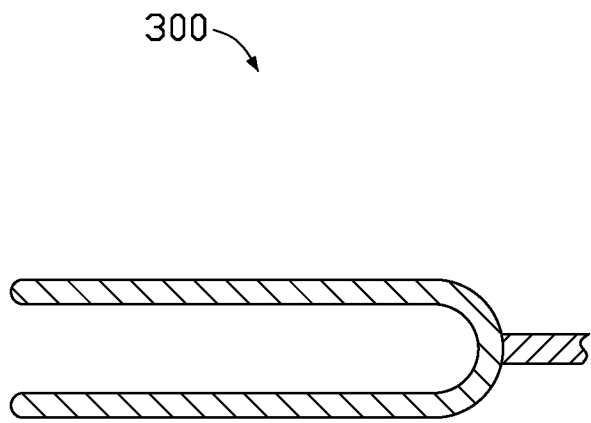
FIG. 4 is a bottom view of a mechanical arm of the lifting device of FIG. 1.

Referring to FIG. 2C, the coil 40 is switched from being applied with the negative voltage to a positive voltage. The magnetic bar 20 moves out of the cavity 13 and the through hole 61, and passes through the mechanical arm 300 to lift the silicon wafer 200 up, and the magnetic bar 20 moves until the spring 30 is stretched to a limit. In one embodiment, the positive voltage is 24 volts. As shown in FIG. 4, the mechanical arm 300 is U-shaped. When the mechanical arm 300 is carrying the silicon wafer 200, the magnetic bar 20 can pass through the mechanical arm 300 to support the silicon wafer 200. After the silicon wafer 200 is supported by the magnetic bar 20, the mechanical arm 300 can be removed from a left side or a right side of the silicon wafer 200 and is no longer above the lifting device 100.

Figure 2D:
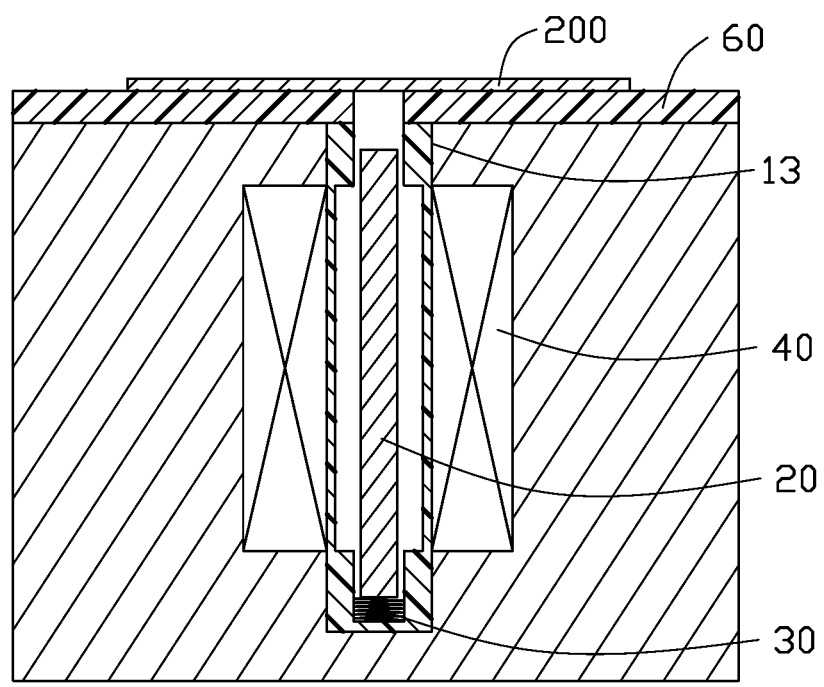
FIG. 2D shows the silicon wafer is on a supporting surface of the lifting device for plasma etching.

Referring to FIG. 2D, the coil 40 is switched from being applied with the positive voltage to the negative voltage (−24 volts), and the magnetic bar 20 moves to compress the spring 30 and completely retreat into the cavity 13. The magnetic bar 20 moves until the spring 30 is compressed to be a limit. The limit means that the spring 30 cannot be further compressed. At this time the silicon wafer 200 falls onto the electro-static chuck 60, and the silicon wafer 200 can then be processed, such as by plasma etching. During the processing of the silicon wafer 200, the negative voltage (−24 volts) must be maintained.

Figure 2E:
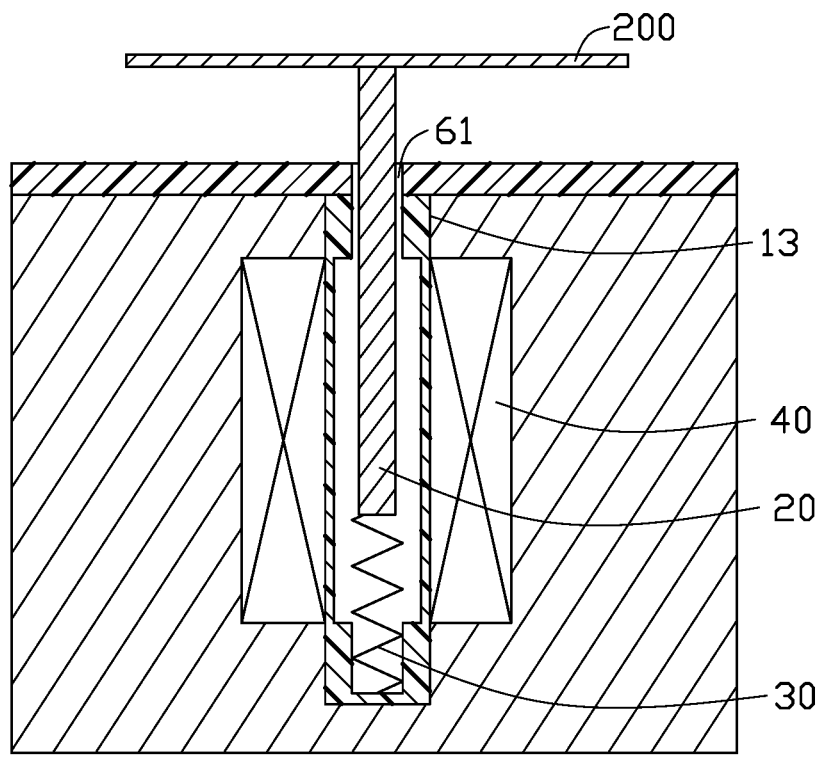
FIG. 2E shows the silicon wafer after plasma etching is lifted up by the magnetic bar of the lifting device.

Referring to FIG. 2E, after the silicon wafer 200 is processed, the coil 40 is switched from being applied with the negative voltage to the positive voltage (24 volts), and the magnetic bar 20 moves outside of the cavity 13 and the through hole 61 to lift up the silicon wafer 200. The magnetic bar 20 moves until the spring 30 is stretched to the limit.

Figure 2F:
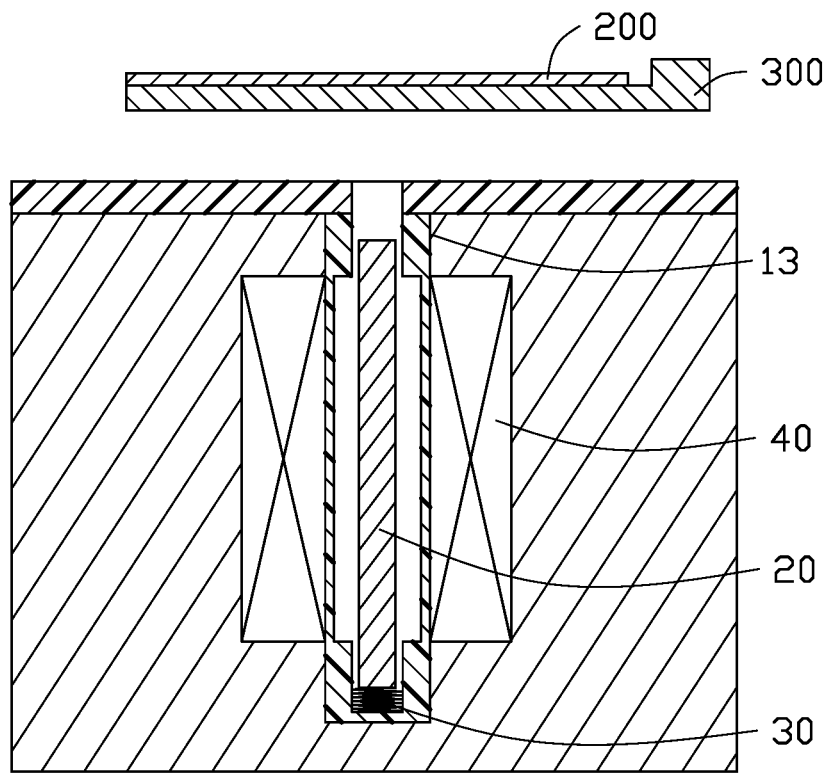
FIG. 2F shows the silicon wafer is taken away from the lifting device.

The coil 40 is applied with a positive voltage (24 volts) and the magnetic bar 20 keeps supporting the silicon wafer 200, and then the vacant mechanical arm 300 moves from a side of the silicon wafer 200 to be above the lifting device 100, and the magnetic bar 20 passes through the U-shaped mechanical arm 300. At this time, the silicon wafer 200 is still supported by the magnetic bar 20. As shown in FIG. 2F, the coil 40 is then switched from being applied with the positive voltage to being applied with the negative voltage (−24 volts), and the magnetic bar 20 moves to compress the spring 30 and completely retreat into the cavity 13. At this time the silicon wafer 200 will land on the mechanical arm 300 and be carried by the mechanical arm 300.

Figure 2G:
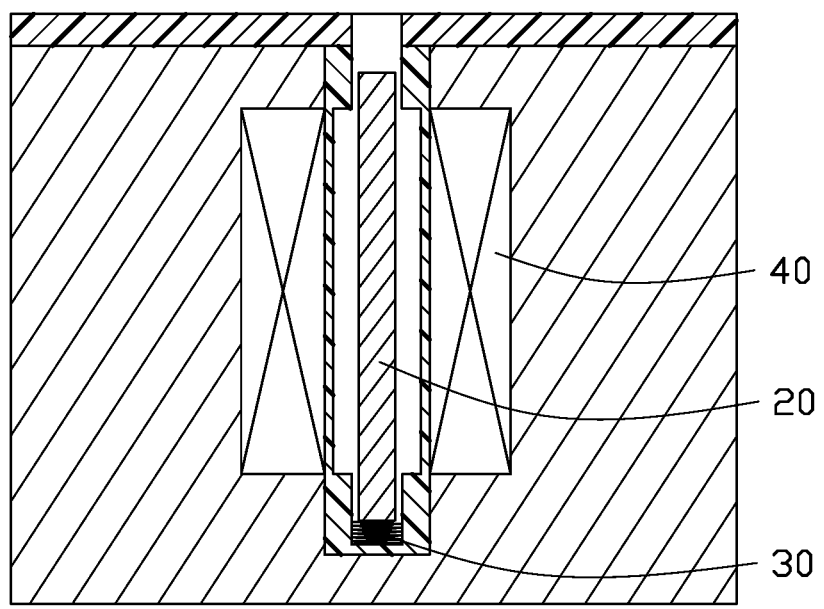
FIG. 2G shows the lifting device is in a state of waiting for a product again.

Referring to FIG. 2G the coil 40 is applied with the negative voltage (−24 volts), and the mechanical arm 300 and the processed silicon wafer 200 move away and are no longer above the lifting device 100. The coil 40 then continues to be applied with the negative voltage to await the mechanical arm 300 carrying with a new silicon wafer 200.

The lifting device 100 drives the magnetic bar 20 to move up by the electromagnetic induction between the coil 40 and the magnetic bar 20 to lift up the product. The lifting device 100 has a simple structure and good lifting stability.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A lifting device, comprising:
   a base body, the base body comprising a supporting surface and defining a cavity, the cavity extending through the supporting surface;
   a magnetic bar in the cavity;
   a spring in the cavity, the spring comprising a first end fixed to an end of the magnetic bar away from the supporting surface and a second end fixed on a wall of the cavity, the first end being opposite to the second end; and
   a coil in the cavity and surrounding the magnetic bar;
   wherein when the coil is applied with a voltage to generate an electromagnetic induction, the magnetic bar is driven to move out of the cavity from the supporting surface or move to compress the spring; and
   wherein the lifting device is configured for loading a product to be plasma etched.

2. The lifting device of claim 1, wherein when the coil is applied with a positive voltage, the magnetic bar moves to stretch the spring; and
   when the coil is applied with a negative voltage, the magnetic bar moves to compress the spring.

3. The lifting device of claim 1, wherein when the coil is applied with a negative voltage, the magnetic bar moves to stretch the spring; and
   when the coil is applied with a positive voltage, the magnetic bar moves to compress the spring.

4. The lifting device of claim 1, wherein the base body is made of a metal or an alloy.

5. The lifting device of claim 4, further comprising an electro-static chuck on the supporting surface;
   wherein the electro-static chuck is made of ceramic, and the electro-static chuck is configured for supporting the product.

6. The lifting device of claim 5, wherein the electro-static chuck defines a through hole; and
   the through hole aligns with the cavity.

7. The lifting device of claim 4, further comprising a spacer in the cavity;
   wherein the spacer is made of ceramic and configured to prevent plasma from contacting any wall of the cavity.

8. The lifting device of claim 7, wherein the spacer has a hollow cylindrical shape; and
   the spacer surrounds the magnetic bar and the spring.

9. The lifting device of claim 8, wherein the spacer defines a channel;
   the magnetic bar and the spring are in the channel;
   when the coil is applied with a voltage, the magnetic bar moves along the channel;
   the second end of the spring is fixed to the spacer.

10. The lifting device of claim 9, wherein the coil surrounds the spacer.

11. The lifting device of claim 1, further comprising an insulation layer completely covering the magnetic bar, the insulation layer is configured to prevent the plasma from contacting the magnetic bar.

12. The lifting device of claim 1, wherein the spring is made of insulators and the spring is insulated from plasma.

13. A lifting device, comprising:
    a base body, the base body comprising a supporting surface and defining a cavity, the cavity extending through the supporting surface, and the base body is made of a metal or an alloy;
    a magnetic bar movably arranged in the cavity between a retracted position and a exerted positon;
    a spring in the cavity, the spring comprising a first end fixed to an end of the magnetic bar away from the supporting surface and a second end fixed on a wall of the cavity, the first end being opposite to the second end, the spring being configured to apply a force on the magnetic bar;
    a coil in the cavity and surrounding the magnetic bar; and
    an electro-static chuck on the supporting surface configured for supporting the product, wherein the electro-static chuck is made of ceramic, and the electro-static chuck defines a through hole aligning with the cavity,
    wherein when the coil is applied with a voltage, an electromagnetic induction is generated to drive the magnetic bar to move;
    wherein when the magnetic bar is in the retracted position, the magnetic bar is completely in the cavity and the spring is compressed; when the magnetic bar is in the exerted position, at least a portion of the magnetic bar is outside the cavity and the spring is stretched;
    wherein the lifting device is configured for loading a product to be plasma etched.

14. The lifting device of claim 13, wherein when the coil is applied with a positive voltage, the magnetic bar moves to stretch the spring;
when the coil is applied with a negative voltage, the magnetic bar moves to compress the spring.

15. The lifting device of claim 13, wherein when the coil is applied with a negative voltage, the magnetic bar moves to stretch the spring;
when the coil is applied with a positive voltage, the magnetic bar moves to compress the spring.

16. The lifting device of claim 13, further comprising a spacer in the cavity;
wherein the spacer is made of ceramic and configured to prevent the plasma from contacting any wall of the cavity.

17. The lifting device of claim 16, wherein the spacer is a hollow cylindrical shape;
the spacer surrounds the magnetic bar and the spring; and
the coil surrounds the spacer.

* * * * *